United States Patent
Cadigan et al.

(10) Patent No.: US 8,627,158 B2
(45) Date of Patent: Jan. 7, 2014

(54) FLASH ARRAY BUILT IN SELF TEST ENGINE WITH TRACE ARRAY AND FLASH METRIC REPORTING

(75) Inventors: David D. Cadigan, Brewster, NY (US); Thomas J. Griffin, Salt Point, NY (US); Archana Shetty, Bangalore (IN); Gary A. Tressler, Sandy Hook, CT (US); Dustin J. Vanstee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 13/314,657

(22) Filed: Dec. 8, 2011

(65) Prior Publication Data

US 2013/0151914 A1    Jun. 13, 2013

(51) Int. Cl.
*G11C 29/00* (2006.01)
(52) U.S. Cl.
USPC .......................... 714/723; 714/718
(58) Field of Classification Search
USPC ...................... 714/718, 723, 763; 365/185.33
See application file for complete search history.

(56) References Cited

U.S. PATENT DOCUMENTS

| | | | |
|---|---|---|---|
| 6,058,047 A * | 5/2000 | Kikuchi | 365/185.33 |
| 6,560,740 B1 | 5/2003 | Zuraski, Jr. et al. | |
| 6,831,865 B2 * | 12/2004 | Chang et al. | 365/185.33 |
| 7,137,027 B2 * | 11/2006 | Shiota et al. | 714/5.1 |
| 7,167,399 B2 * | 1/2007 | Wooldridge | 365/185.29 |
| 7,277,011 B2 * | 10/2007 | Estakhri | 340/540 |
| 7,302,625 B1 | 11/2007 | Payakapan et al. | |
| 7,421,636 B2 | 9/2008 | Kang et al. | |
| 7,603,603 B2 | 10/2009 | Dubey | |
| 7,607,055 B2 | 10/2009 | Jung et al. | |
| 7,865,761 B1 * | 1/2011 | Chilton | 714/2 |
| 2004/0049724 A1 | 3/2004 | Bill et al. | |
| 2010/0017664 A1 | 1/2010 | Jang | |
| 2011/0072302 A1 * | 3/2011 | Sartore | 714/6.32 |

FOREIGN PATENT DOCUMENTS

EP          1826580 A1    8/2007
WO    WO2004010437 A1    1/2004

* cited by examiner

*Primary Examiner* — James C Kerveros
(74) *Attorney, Agent, or Firm* — Cantor Colburn LLP; William A. Kinnaman, Jr.

(57) ABSTRACT

A mechanism is provided for a flash array test engine. The flash array test engine includes a circuit. The circuit is configured to generate test workloads in a test mode for testing a flash device array, where each of the test workloads includes specific addresses, data, and command patterns to be sent to the flash device array. The circuit is configured to accelerate wear in the flash device array, via the test workloads, at an accelerated rate relative to general system workloads that are not part of the test mode. The circuit is configured to vary a range of conditions for the flash device array to determine whether each of the conditions passes or fails and to store failure data and corresponding failure data address information for the flash device array.

20 Claims, 8 Drawing Sheets

FLASH ARRAY BUILT IN SELF TEST ENGINE WITH TRACE ARRAY AND FLASH METRIC REPORTING

BACKGROUND

Exemplary embodiments relate to flash memory devices, and more specifically, to performing built in self test of an array of flash memory cells.

Flash memory is a nonvolatile computer storage chip that can be electrically erased and reprogrammed. It was developed from EEPROM (electrically erasable programmable read only memory) and must be erased in fairly large blocks before these can be rewritten with new data. The high density NAND (not and) type must also be programmed and read in (smaller) blocks, or pages, while the NOR (not or) type allows a single machine word (byte) to be written and/or read independently.

The NAND type of flash memory is primarily used in memory cards, USB (universal serial bus) flash drives, solid state drives (SSD), and similar products, for general storage and transfer of data. The NOR type, which allows true random access and therefore direct code execution, is used as a replacement for the older EPROM and as an alternative to certain kinds of read only memory (ROM) applications.

Flash memory is a memory chip that maintains stored information without requiring a power source. It is often used in portable electronics, like MP3 players, and in removable storage devices. Flash memory differs from regular EEPROM in that EEPROM erases its content one byte at a time. This makes it slow to update. Flash memory can erase its data in entire blocks, making it a desired technology for applications that require frequent updating of large amounts of data as in the case of a memory stick.

Inside the flash memory (chip), information is stored in cells. A floating gate (FG) protects the data written in each cell. Tunneling electrons pass through a low conductivity material to change the electronic charge of the gate in "a flash," clearing the cell of its contents so that it can be rewritten. This is how flash memory gets its name.

Flash memory stores information in an array of memory cells made from floating gate transistors. In traditional single-level cell (SLC) devices, each cell stores only one bit of information. Some newer flash memory, known as multi-level cell (MLC) devices, can store more than one bit per cell by choosing between multiple levels of electrical charge to apply to the floating gates of its cells.

The floating gate of a floating gate transistor may be conductive (typically polysilicon in most kinds of flash memory) or non-conductive. In flash memory, each memory cell resembles a standard MOSFET (metal oxide semiconductor field effect transistor), except the transistor has two gates instead of one. On top is the control gate (CG), as in other MOS transistors, but below this there is a floating gate insulated all around by an oxide layer. The floating gate is interposed between the control gate and the MOSFET channel. Because the floating gate is electrically isolated by its insulating layer, any electrons placed on it are trapped there, and under normal conditions, will not discharge for many years. When the floating gate holds a charge, it screens (partially cancels) the electric field from the control gate, which modifies the threshold voltage (VT) of the cell. During read-out, a voltage intermediate between the possible threshold voltages is applied to the control gate, and the MOSFET channel will become conducting or remain insulating, depending on the threshold voltage of the cell, which is in turn controlled by charge on the floating gate. The current flow through the MOSFET channel is sensed and forms a binary code, reproducing the stored data. In a multilevel cell device, which stores more than one bit per cell, the amount of current flow is sensed (rather than simply its presence or absence), in order to determine more precisely the level of charge on the floating gate.

BRIEF SUMMARY

According to exemplary embodiments, a flash array test engine is provided. The flash array test engine includes a circuit. The circuit is configured to generate test workloads in a test mode for testing a flash device array, where each of the test workloads includes specific addresses, data, and command patterns to be sent to the flash device array. The circuit is configured to accelerate wear in the flash device array, via the test workloads, at an accelerated rate relative to general system workloads that are not part of the test mode. The circuit is configured to vary a range of conditions for the flash device array to determine whether each of the conditions passes or fails and to store failure data and corresponding failure data address information for the flash device array.

According to an exemplary embodiment, a method for a flash array test engine circuit is provided. The method includes generating test workloads in a test mode for testing a flash device array, where each of the test workloads includes specific addresses, data, and command patterns to be sent to the flash device array. The method includes accelerating wear in the flash device array, via the test workloads, at an accelerated rate relative to general system workloads that are not part of the test mode. The method includes varying a range of conditions for the flash device array to determine whether each of the conditions passes or fails, and storing failure data and corresponding failure data address information for the flash device array.

According to an exemplary embodiment, a computer program product for a flash array test engine circuit is provided. The computer program product includes a computer readable storage medium having computer readable program code embodied therewith. The computer readable program code is configured for generating test workloads in a test mode for testing a flash device array, where each of the test workloads includes specific addresses, data, and command patterns to be sent to the flash device array. The computer readable program code is configured for accelerating wear in the flash device array, via the test workloads, at an accelerated rate relative to general system workloads that are not part of the test mode. The computer readable program code is configured for varying a range of conditions for the flash device array to determine whether each of the conditions passes or fails, and storing failure data and corresponding failure data address information for the flash device array.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

DETAILED DESCRIPTION

Figure 1:
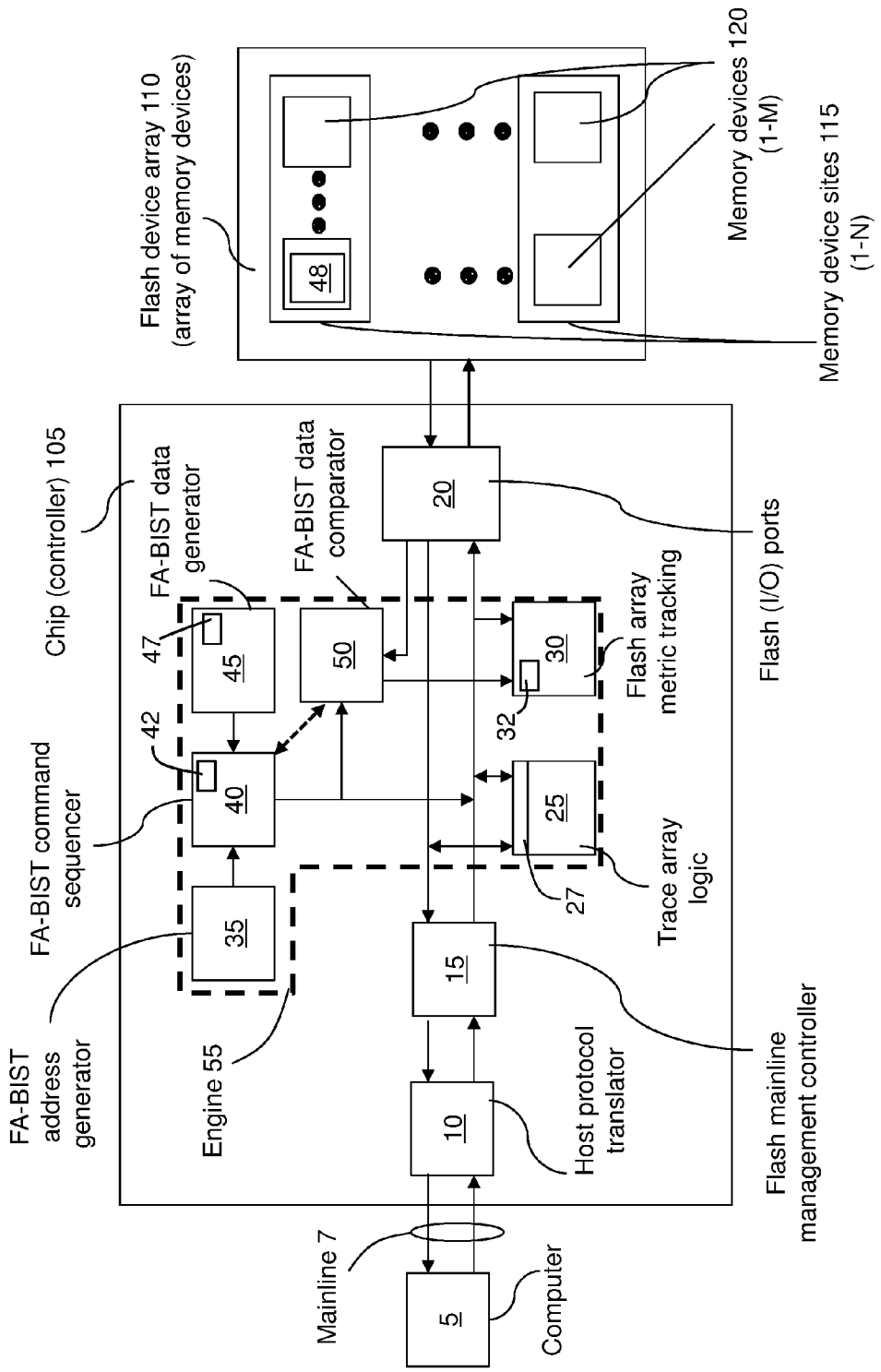
FIG. 1 is a block diagram of a system illustrating a controller chip integrated flash array test engine that can be utilized to analyze a flash device array for reliability metrics and for debug purposes according to an exemplary embodiment.
Figure 4:
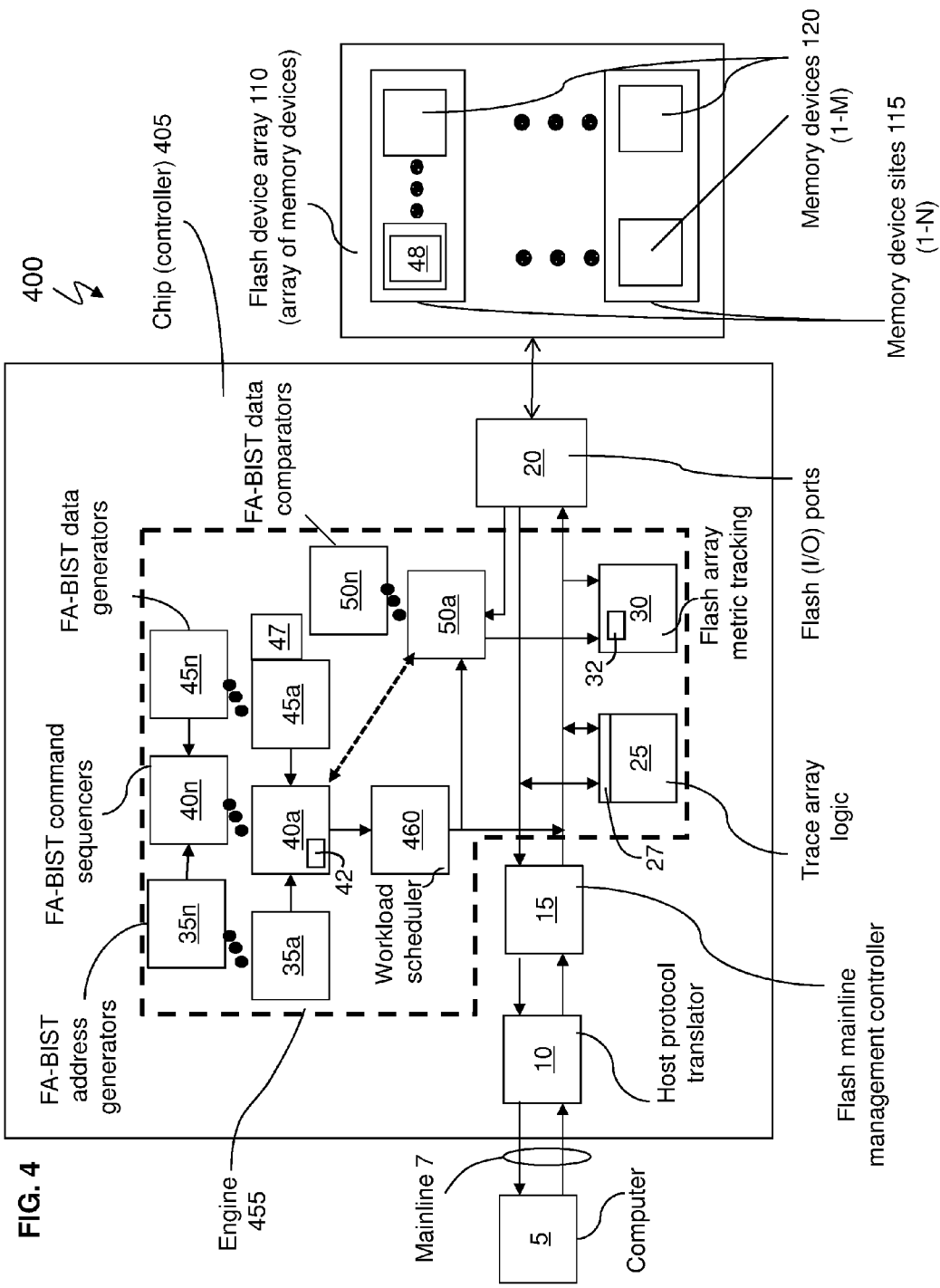
FIG. 4 is a block diagram of a system illustrating a controller chip according to an exemplary embodiment.

Exemplary embodiments are configured to provide a design that integrates into existing flash controller architectures and can be used during special test modes. Exemplary embodiments provide a controller chip (e.g., integrated circuit chip) with a flash array built in self test (FA-BIST) engine for testing an array of flash memory devices as shown in FIGS. 1 and 4. Typically, the flash array built in self test (FA-BIST) engine may be configured and invoked under debug conditions (e.g., during a test mode).

Integrating flash memory devices into a solid state drive (SSD) and/or into an existing flash (controller) design may have reliability and functional challenges. For example, in exemplary embodiments, the controller chip of the flash memory devices is configured to understand and account for the existing raw bit error rate in the flash memory devices on a per block basis, and understand/account for when the implemented error code correction (ECC) scheme (of the flash memory devices being tested) will fail, because the controller chip is configured with the same ECC scheme.

For example, exemplary embodiments can leverage the FA-BIST engine to test different targeted blocks and collect information about raw bit error rates, and to evaluate flash vendor endurance claims and specifications after program erase (PE) cycling and data retention testing. Also, the FA-BIST engine can be programmed to test flash memory devices in a solid state drive under controlled parameters similar to (or the same as) vendor specifications.

The FA-BIST engine on the controller chip is configured to accelerate flash memory device wearing. For example, hardware assisted flash memory device wearing can speed up the rate of device wear using the FA-BIST engine. However, if general mainline control is used (without the FA-BIST engine of exemplary embodiments), this same wear on the memory cells of the flash memory device can typically take years to accomplish. This is because the FA-BIST engine is configured to continuously read, write, erase, etc., the same block or page in the flash memory device (without passing through a flash mainline management controller as shown in FIGS. 1 and 4). However, any read, write, and erase commands from a host system (computer) passes through the flash mainline management controller and are spread across available memory of the flash memory device.

The FA-BIST engine is configured to test physical block(s) of memory in the flash memory devices and understand/recognize failure mechanisms (such as bad blocks due to stuck faults, too high of a bit error rate (BER), etc.), to utilize trace array failure logging to understand/recognize modes of failure, to specify a specific addressing and data pattern to a block of physical memory, and to be utilized for general debugging of the flash memory devices.

All previous activity (testing/functional) to a memory cell affects its current cell behavior, and the FA-BIST engine is configured to monitor activity (including normal activity) over time independent of the flash device operation mode (e.g., independent of operating in a test mode). Integrated flash metric collection hardware (e.g., trace array logic and/or flash array metric tracking modules) monitors flash device usage statistics during the life of the flash device array.

The FA-BIST engine on the controller chip can integrate external changing variables to create SSD stress to failure maps (also referred to as SSD level shmoos). The FA-BIST engine can be configured with the capability of measuring timing margins of synchronous signals in a system (e.g., in the array of flash memory devices) that has a bit error rate greater than 0, and measuring voltage and temperature to produce voltage versus temperature graphs for the flash memory devices.

Now turning to the figures, FIG. 1 is a block diagram of a system 100 of a controller chip integrated flash array built in test engine (FA-BIST) that can be utilized to analyze a flash device array for reliability metrics and for debug purposes according to an exemplary embodiment.

The system 100 illustrates include a host computer 5 operatively connected to and/or coupled to a controller chip 105 via a mainline bus 7. The controller chip 105 is configured to control reading and writing to a flash device array 110 (also referred to as a flash device). Also, the controller chip 105 is configured to analyze the flash device array 110 via a trace array logic module 25, flash array metric tracking module 30, FA-BIST address generator module 35, FA-BIST command sequencer module 40, FA-BIST data generator module 45, and FA-BIST data comparator 50, all of which comprise the FA-BIST engine 55. The modules/circuits 25, 30, 35, 40, 45, and 50 of the FA-BIST engine 55 can be implemented as hardware such as but not limited to an application specific integrated circuit (ASIC), a field programmable gate array (FPGA), etc., as software executing on hardware, and/or as a combination of both. The controller chip 105 may be implemented in (a circuit of) a processor chip, in a computer (such as the computer 5), and/or as a stand-alone chip.

The flash device array 110 is configured to store data and read data from an array of (flash) memory devices 120. There may be 1 through M memory devices 120 in an array of (flash) memory device sites 115, with N representing a last memory device 120. There may be 1 through N memory device sites 115, with N representing a last memory device site 115. As understood by one skilled in the art, each memory device 120 may correspond to one or more memory cells for storing data. The memory cells can be made up of transistors configured to store data.

During normal operation mode (i.e., not in test mode), the computer 5 can send read and write commands over the mainline bus 7 to a host protocol translator 10. The host protocol translator 10 is a command interface input and output (I/O) that receives the mainline command from the computer 5 and translates the mainline command into actions which may be a read and store/write command on the flash device array 110. A flash mainline management controller 15 receives the mainline command (read and write commands) from the host protocol translator 10 and provides the mainline command to flash (I/O) ports 20 to perform the respective read command and write command on (e.g., intentionally spread across) various memory devices 120 on the flash device array 110. The mainline bus 7 is connected from the computer 5, via elements 10, 15, and 20 to the flash device array 110. The FA-BIST engine 55 is configured to capture various data during the normal operation mode by snooping on the mainline bus 7, which is discussed further herein.

The controller chip 105 may be initiated by the computer 5 to execute test mode (and/or debug mode). For example, the controller chip 105 may receive a test command from the computer 5 on the mainline bus 7. During test mode, the FA-BIST engine 55 is configured to analyze the memory devices 120 of the flash device array 110.

The address generator 35 is configured to specify the flash array address boundaries for testing of the flash device array 110, and the flash array addresses and/or boundaries are input to the command sequencer 40. The data pattern generator 45 is configured to create fixed data patterns and/or pseudo random data patterns for testing the flash device array 110, and input the fixed/pseudo random data patterns to the command sequencer 40. The fixed data patterns and/or pseudo random data patterns are an arranged collection of data to be written to (and/or erased from) the flash device array 110.

The command sequencer 40 receives input from the address generator 35 and the data pattern generator 45. The command sequencer 40 is configured to generate the erase, program, and read commands (i.e., command primitives) to the flash device array 110 with proper command timings. The command timings can be according to an algorithm and/or can be deterministic.

The data comparator (circuit) 50 is configured to execute different flash comparison schemes (such as ECC mode, RAW mode, random data mode, etc.,) to determine if the data pattern read out of flash device array 110 (device under test (DUT)) failed or passed. ECC mode means that when data is read back, the extra check bits encoded are used to verify the integrity of the data. In RAW mode, the data integrity is checked based on using expected data patterns. For example, RAW mode would be a fixed data mode where the data read back is a deterministic value every time. Another example is random data mode using a pseudo random number generator to create a predictable sequence of data patterns. The data comparator 50 receives the command from the command sequencer 40 along with the input data pattern and receives the output data pattern that comes from the flash device array 110. The input and output data patterns should be the same. The data comparator 50 is configured to compare the input data pattern and the output data pattern, execute any error code correction (which is designed to be the same as the vendor applied ECC for the flash device array 110) on the output data pattern if necessary, and output comparison data to the flash array metric tracking module 30.

The flash array metric tracking module 30 (which is a per block data collection unit and/or counter) is configured to collect/snoop (store) data from the mainline bus 7 and to collect data from the data comparator 50 on a per command, block, page, and/or ECC sector basis. Also, the flash array metric tracking module 30 is configured to perform per command based tracking and fail bits per sector tracking as further discussed in a table below. The flash array metric tracking module 30 is configured to be utilized in both mainline operation (i.e., normal operation) and FA-BIST engine 55 operations to track flash array metrics of the flash device array 110. The output comparison data and mainline operation data collected by flash array metric tracking module 30 may include cycling data, bit error rate (BER) data, frequency of access data, and utilization data, all corresponding to the flash device array 110.

The trace array logic (module) 25 is configured to collect data from the mainline bus 7 going to and from the flash device array 110. Trace array logic 25 is configured with FA-BIST logging capability, and is configured to capture command traces during real time operation (i.e., normal/mainline operation) of the flash device array 110, e.g., when the computer 5 sends read and write commands to the flash device array 110. Also, trace array logic module 25 is configured to collect failure logs that contain memory address (location) and data payload of failed read commands from the flash device array 110. The trace array logic module 25 also includes a command replay mechanism, which uses information from the trace array to replay a sequence of commands that were directed to the flash device array 110.

Further, details of the operation of the FA-BIST engine 55 are provided below. Assume that the FA-BIST engine 55 has been initiated by a user of the control chip 105, that the FA-BIST engine 55 is running a periodic test of the flash device array 110, the FA-BIST engine 55 has been initiated by a user of the computer 5, and/or the FA-BIST engine 55 is turned on (initiated, e.g., for snooping).

The address generator 35 is configured to generate a stream of addresses associated with a command primitive in the command sequencer 40 and inputs the stream of addresses to the command sequencer 40. Each address stream requires configuration registers (e.g., registers 42 in the command sequencer 40) to set up an address range and/or set of address ranges. Each address range (of the command sequencer 40) is a logical address space that can be physically mapped (to individual cells (including blocks or pages) in each of the individual memory devices 120 in the flash device array 110) to span all the way from a single page/block (within a single memory device 120) to multiple memory devices 120. Additional configuration for each address range is used (by the command sequencer 40) to describe the type of address generation such as deterministic (i.e. fixed pattern, sequential, etc.) and/or pseudo random.

The data pattern generator 45 is configured to create a stream of data patterns associated with a command primitive in the command sequencer 40. The command primitives requiring data to be driven to the flash device array 110, usually program (write) operations and/or a sequence of program operations, would use the data pattern generator 45 for this purpose. Each data stream from the data pattern generator 45 has a configuration that describes a data pattern and/or set of data patterns. Inherent to each data pattern configuration is the type of data generation, e.g., deterministic data pattern or pseudo random data pattern. Deterministic data pattern definitions can be derived from a fixed pattern generator (implemented by the data pattern generator 45) and/or consist of patterns stored in a piece of buffer memory on the controller chip 105 and/or on the flash device array 110. The buffer memory can be volatile random access memory (RAM) (that, e.g., can be coupled to the data pattern generator 45 on the controller chip 45 such as buffer memory 47) and/or some section of the flash device array 110 (flash media) itself (such as buffer memory 48). The random data pattern definition will leverage a random data generator (e.g., implemented by the data pattern generator 45) so that pseudo random data can be deterministically generated.

The command sequencer 40 may be the central engine for the FA-BIST engine 55 (function). The command sequencer 40 generates and/or operates on a command set primitive that can be as simple as a single flash device command and/or as complex as a concatenation of multiple flash commands to the flash device array 110. Buffer memory 47 and/or 48 may be utilized to define the set of program (write) and/or read operations to be executed in a single command set primitive. Associated with each program and/or read operation in the command set primitive is an address range and/or address generation stream (via the address generator 35), and, if desired, an associated data pattern generation/comparison stream (for later comparison by the data comparator 50).

The command sequencer 40 is coupled to the flash interface specifications and resolves the elements of the command set primitive into flash commands. For complex command primitives, command sequencing by the command sequencer 40 can consist of modes that control the number of program-erase (PE) (i.e., writing and erasing) cycles to an address range, and/or the number of read cycles to an address range. A complex command primitive can incorporate a higher level command syntax as shown in FIG. 2 that exercises a higher level diagnostic sequence such as the example shown in FIG. 3 for program disturbance effect evaluation.

The command sequencer 40 transmits the command primitive to request a read command, erase command, and/or write command, or other flash support command (for the designated address range) to the flash device array 110 on the mainline bus 7 via the flash (I/O) ports 20.

The data pattern comparator 50 is configured to take as input a stream of data associated with a command primitive from the command sequencer 40. The command primitives requiring data to be read from the flash device array 110, usually read operations and/or a sequence of read operations, would use the data comparator 50 for validation of these operations (e.g., read operations) that should be performed by the flash device array 110. The data comparator 50 is configured to use the fixed pattern generator and/or buffer memory 47, 48 (associated with the appropriate deterministic program operation(s)) for deterministic data comparison and/or use the random data pattern generator (associated with the appropriate random data program operation(s)) for pseudo random data comparison. The data comparator 50 is configured to also apply different error correcting schemes to determine pass/fail thresholds for the different levels of correctability.

Figure 2:
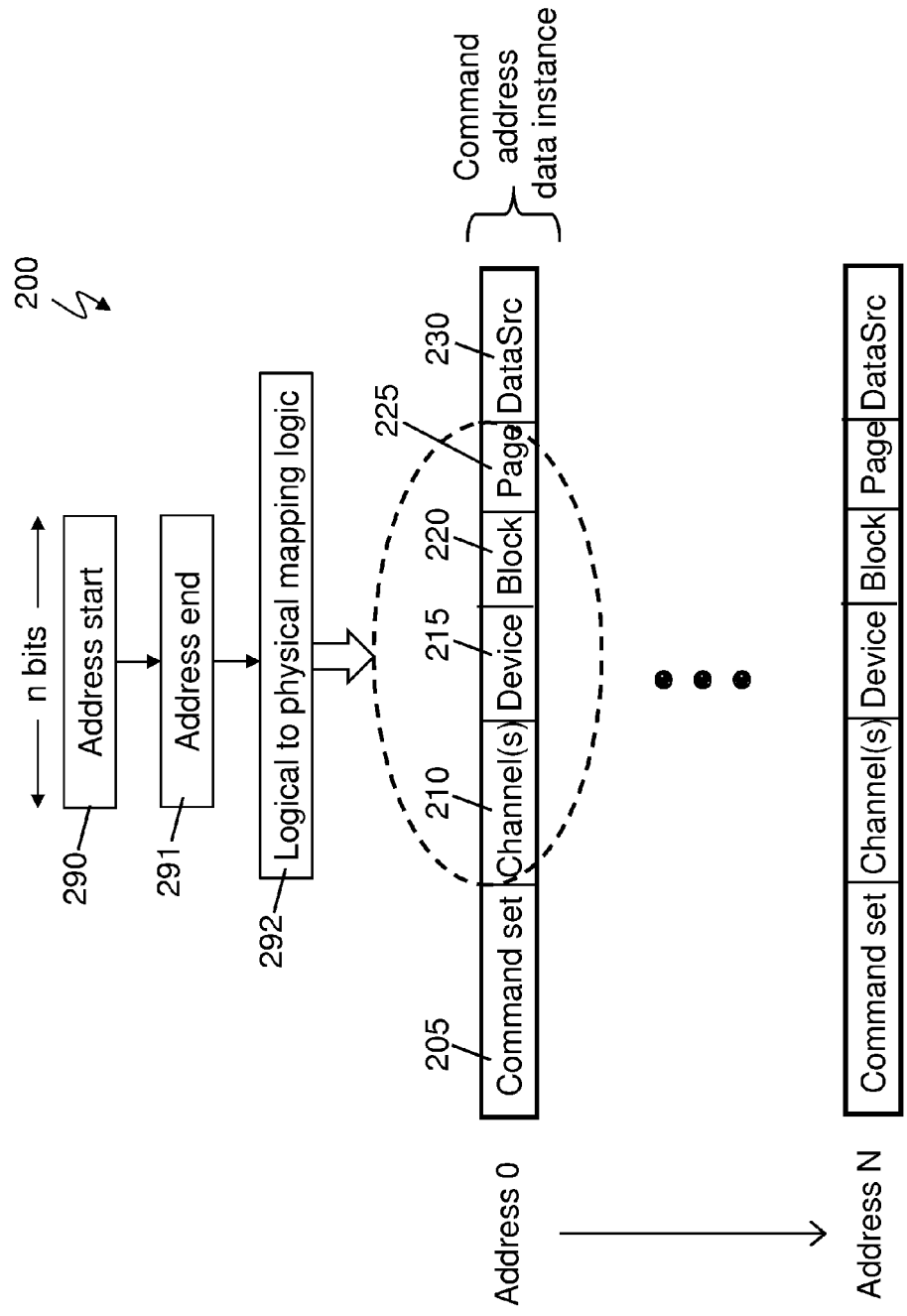
FIG. 2 is a block diagram illustrating an example command primitive that can incorporate a higher level command syntax according to an exemplary embodiment.

Now turning to FIG. 2, a block diagram illustrates an example command set primitive 200 that can incorporate a higher level command syntax according to an exemplary embodiment. The command set primitive 200 shown in FIG. 2 may be generated by the command sequencer 40.

The command set primitive 200 may include the command set 205 to be executed such as an ordered list of read command, erase command, write command, etc., by the flash device array 110, and the channels 210. Each command set 205 will be executed for the address specified in the command primitive 200. Channels are another physical addressing descriptor. For example, a typical solid state drive (SSD) can have 16 flash sites, with 8 high stacks of flash devices (e.g., flash memory devices 120) at each site. In this description, the channel is the bus that connects the controller to one of the flash sites (e.g., flash memory device sites 115).

The command set primitive 200 may also include memory device identification 215 which can be defined to individually correspond/associate to the one or more memory devices 120 at one or more memory device sites 115. The command set primitive 200 also identifies the particular block(s) under test (BUT) 220 within each individually identified memory device 120 of the flash device array 110 (for which the command 205 is to be executed). The command set primitive 200 may identify the (exact) page(s) under test (PUT) 225 for which the command set 205 is to be executed in the flash device array 110.

The command set primitive 200 may also specify the data source (dataSrc) 230 for any data to be written (stored) to the identified memory device 215 (i.e., memory device 120), block 220, and page 225. The data source 230 may be stored in the data generator 45 and/or external to the FA-BIST engine 55.

The command set primitive 200 is one instance of a set of commands sent to a single address. A test will consist of the list of command primitives 200, merged with the address generator output. For example, if the address generator logical start address 290 is set to 0, and the logical end address 291 is set to 99, then there will be 100 sequential addresses generated. These addresses will go through the logical to physical mapping logic 292 to create the physical address defined in the command primitive 200. For each address generated, the command set primitive 200 will be executed. The command sequencer 40 can (repeatedly) generate command set primitives 200 for address 0 through address N, where N represents a last address.

Figure 3:
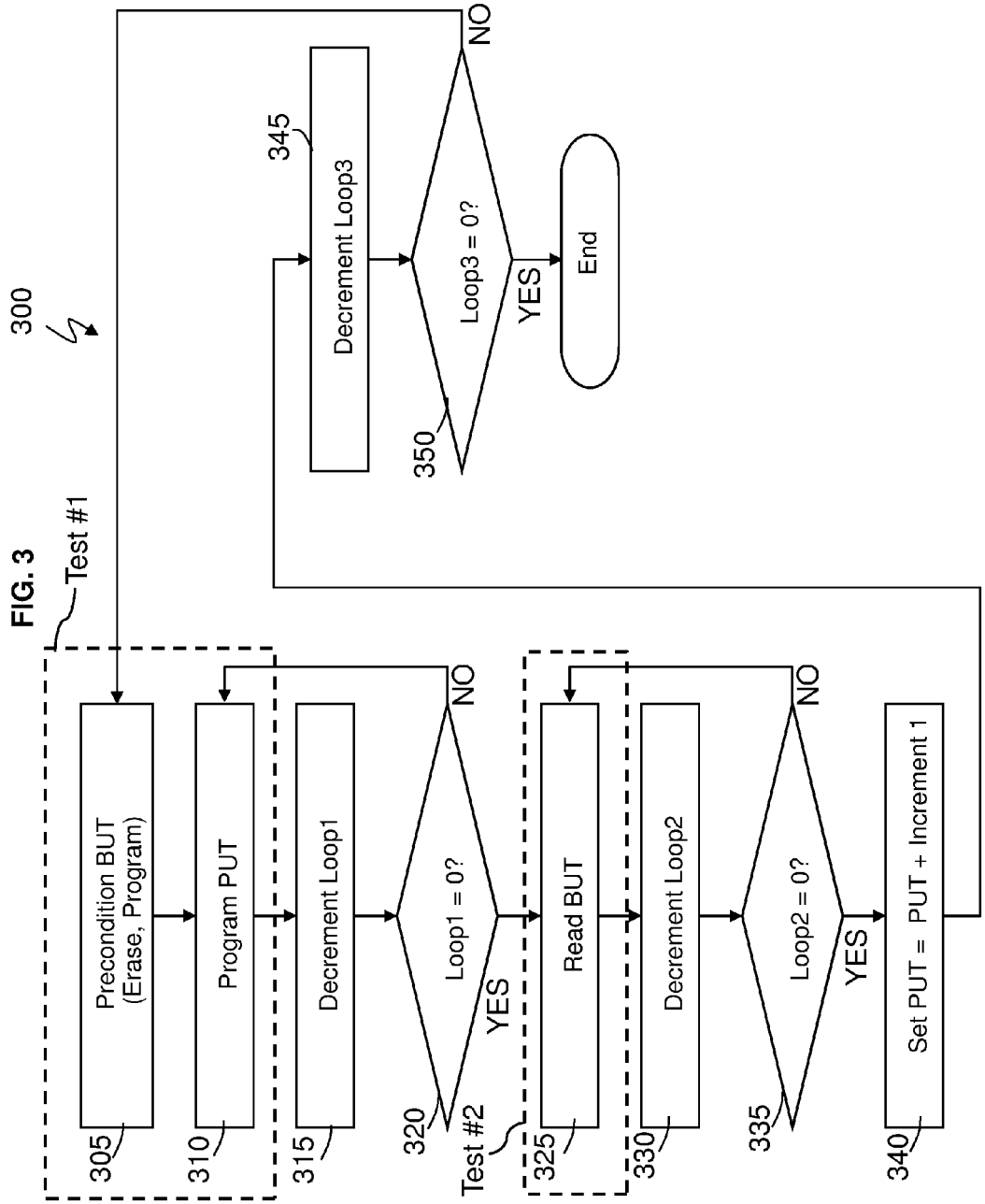
FIG. 3 is a flow chart illustrating a higher level diagnostic sequence for program disturbance effect evaluation according to an exemplary embodiment.

Higher level tests as described in FIG. 3 can be built from multiple test invocations of the FA-BIST engine 55. FIG. 3 highlights how a program disturbance (disturb) can be implemented using two (2) test invocations of the FA-BIST engine 55 along with loop counts and decrement and increment operations that are tracked by computer firmware.

FIG. 3 is a flow chart 300 illustrating a higher level diagnostic sequence for program disturbance effect evaluation (executed by the command sequencer 40 and the data comparator 50) according to an exemplary embodiment. The data comparator 50 may communicate back and forth with the command sequencer 40 to execute the diagnostic sequence of FIG. 3, such that the correct (updated) command set primitive (as illustrated in FIG. 2) is sent to the flash device array 110.

A precondition (e.g., an erase command, a program (write) command, etc.) for the block under test (BUT) is identified/set at block 305. The page under test (PUT) is identified/set at block 310. Loop 1 is decremented at block 315. It is determined whether Loop 1=0 at block 320. If no, the flow proceeds to block 310. If yes, the flow proceeds to read the block under test at block 325. Loop 2 is decremented at block 330. It is determined whether Loop 2=0, and if no, the flow proceeds to block 325. If yes, the page under test (PUT) is set to (the previous) page under test+increment 1 at block 340. Loop 3 is decremented at block 345. It is determined whether Loop 3=0 at block 350, and if no, the flow proceeds to block 305. If yes, the flow ends.

Loop 1=number of times to program the page set in the program disturbance test. The loop count is a variable that can be set in firmware and tracked to a threshold that will determine when test #1 is complete.

Loop 2=read loops portion of test #2. The read loop is used to determine if any previously programmed bits in test #1 were disturbed. The number of bits in error will be recorded.

Loop 3=controls next page to disturbance. Generally this test would only test one page at a time; therefore, the start and end address range for test #1 is of size equal to one page. Loop 3 variable will be maintained in firmware.

By re-running this test and varying the Loop #1 count, it is possible to characterize the number of programs required to disturb adjacent cells.

Further, regarding test #1, test #1 is comprised of blocks 305 and 310. An example embodiment of this test using the command address data block in FIG. 2 would be as follows. The start address 290 would equal 0, and the end address 291 would equal 128 decimal as an example. The logical to physical mapping logic 292 would be configured to map the least significant bit to the least significant page address bit and so on. Assume for this example that there are 128 pages per block. Since erase commands can only occur on block boundaries, an example constraint is that only if the page address equals zero would the erase command be sent. The command set 205 would be erase and program for 128 pages. Only one erase would be sent at the beginning of the test due to the previously mentioned constraint, and then 28 page programs to each page would be issued. For the program PUT (block 310), the address space would then be reconfigured to start and end at the same page, and the command set would only consist of the page program. This test would be executed Loop1 times.

Test #2 would then use the initial address settings configured for the precondition BUT (block 305) test, and the command set 205 would be programmed to a single page read command. The test would be executed and the data would be read out of the flash physical location (memory device 120) and compared to an expected pattern if in RAW mode, or the number of failing bits would be calculated by ECC in ECC data mode. Test #2 will be executed Loop2 times. The first time will attempt to detect any page program disturb sensitivity, and the subsequent times will start to measure read disturb sensitivity.

FIG. 4 illustrates a block diagram of a system 400 for another exemplary embodiment. Each element in the system 400 operates as discussed above for system 100 except as noted below. In system 400, multiple copies of the FA-BIST structure such as the command sequencer 40, the address generator 35, the data pattern generator 45, and the data comparator 50 can be instantiated so that multiple workloads can be driven to the flash device array 110. This requires the addition of another design element, which is a workload scheduler 460. The workload scheduler 460 is configured to take the outputs of the multiple FA-BIST structures and schedule the workloads according to a predefined configurable resource allocation mix. The workload scheduler 460 allows the FA-BIST engine 455 to represent different composite read and write workload operations typical in flash array applications (e.g., required by the computer 5). The multiple command sequencers 40, multiple address generators 35, multiple data pattern generators 45, and multiple data comparators 50 are illustrated as command sequencers 40a-n, address generators 35a-n, data pattern generators 45a-n, and data comparators 50a-n, where n is the last element. The description above for command sequencer 40, the address generator 35, the data pattern generator 45, and the data comparator 50 (in FIG. 1) applies respectively to command sequencers 40a-n, address generators 35a-n, data pattern generators 45a-n, and data comparators 50a-n (in FIG. 4). Also, description for the FA-BIST engine 55 can also apply to the FA-BIST engine 455.

Figure 5:
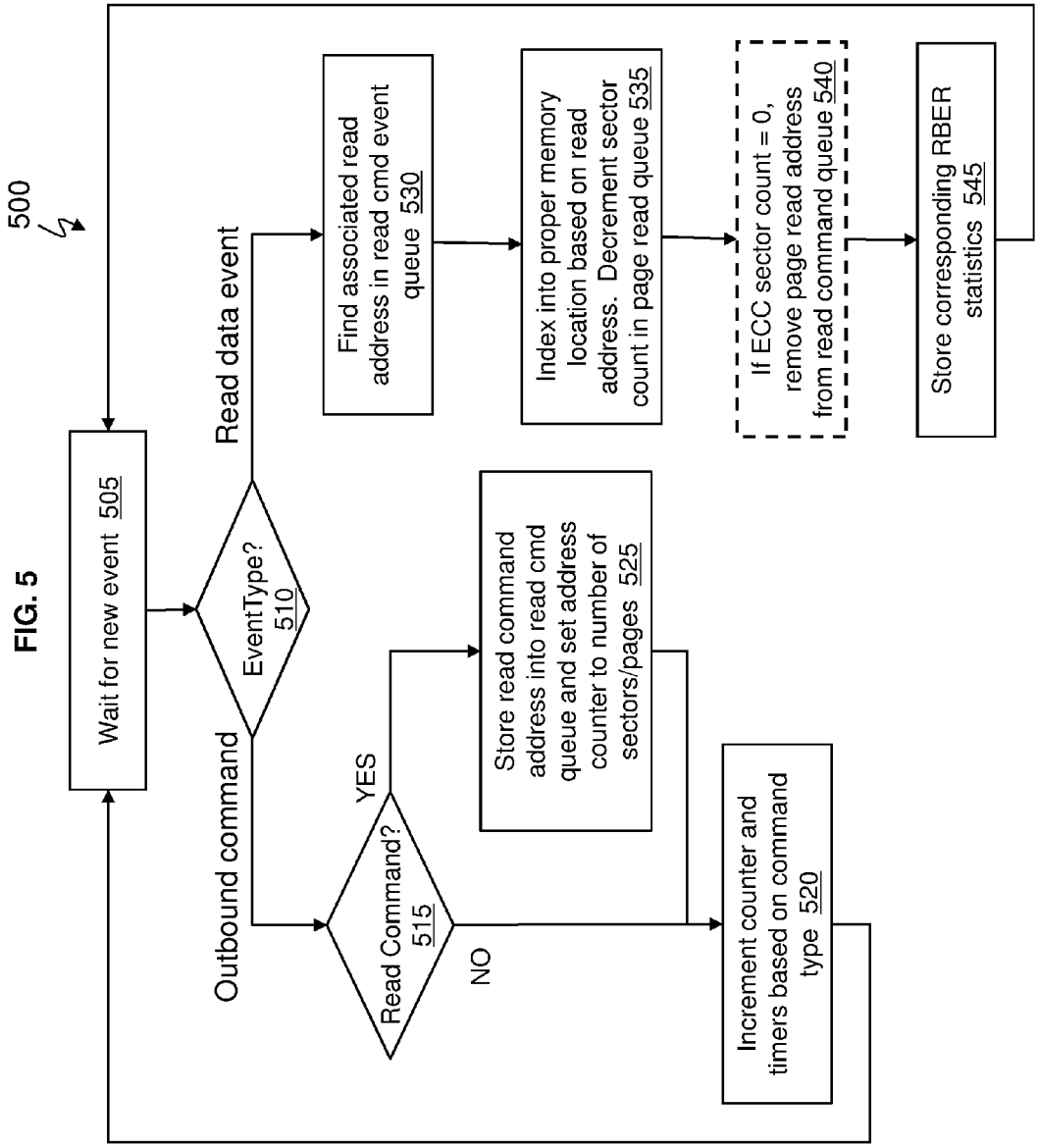
FIG. 5 is a flow chart illustrating details of a flash array metric tracking module according to an exemplary embodiment.

Now turning to FIG. 5, further details of the flash array metric tracking (module/circuit) 30 are provided according to an exemplary embodiment. FIG. 5 is a flow chart 500 illustrating a solid state drive (SSD) event and metric recording executed by the flash array metric tracking module 30.

The flow chart 500 begins with the flash array metric tracking module 30 waiting for new command event having an event type at block 505. The flash array metric tracking module 30 (metric recorder) is typically in a state awaiting new command events to arrive from the mainline bus 7 and/or from the data comparator 50. A command event can be determined as one of two types of events at block 510.

The first type of event is an outbound command to the flash device array 110 such as a page program, block erase, write, etc. The second type of event is a read data event (in which data is read out from the flash device array 110), and the read data event is sent to the flash array metric tracking module 30 via the data comparator 50. The data corresponding to the read data event that is sent to the flash array metric tracking module 30 is the number of failing bits determined by the data comparator 50. The frequency of a read (data) event will be based on the page size of the flash device array 110 and the number of ECC sectors in the (flash) page of the flash device array 110. An ECC sector is defined by the flash vendor (i.e., maker or manufacturer of the flash device array 110) at time of manufacturing, and the ECC sector is typically comprised of the actual data payload and the ECC bytes (B) required to protect the actual data payload. The ECC sector size is the total bytes in the page size divided by a power of 2. For example, a page comprised of 8192B (of actual data)+512B of ECC=8704B, which can be subdivided into 16 ECC sectors each containing 544B (each). After an ECC sector is read from the flash device array 110, the data comparator 50 generates and sends a read event to the flash array metric tracking module 30 (metric tracker) containing the number of failing bits for the (particular) ECC sector read.

When the flash array metric tracking module 30 determines that the event type is an outbound command, the flash array metric tracking module 30 determines whether the outbound command is a read command at block 515.

If the outbound command is not a read command, the flash array metric tracking module 30 increments a corresponding counter and timer based on the command type at block 520. There will be a corresponding counter for each command type decoded for the flash device array 110. For example, typical commands (determined by the flash array metric tracking module 30) may be page read, page program, and block erase; however the description applies to all the command types that are decoded by the flash array metric tracking module 30. For each command type, there will be a corresponding counter (in the flash array metric tracking module 30), and an associated timer keeping track of the previous time (event) the command type was received. The data stored (by the flash array metric tracking module 30) will be counts for each command type, and the inter-arrival time statistics for each command type. Inter-arrival time statistics is the collection of time elapsed between each of the same command types, such as a first, second, third, and so forth of the same command type arriving at the flash array metric tracking module 30. The inter-arrival statistics (of the flash array metric tracking module 30) will measure minimum, maximum, and average inter-arrival times based on (i.e., for each) command type respectively. If it is the first time the command type is sensed by the flash array metric tracking module 30 (metric recorder), then inter-arrival statistics will not be calculated (because there is no second event for this command type), but the timer will be set to the current time and the corresponding counter will be incremented for this particular command type.

When the flash array metric tracking module 30 determines that the outbound command is a read command, the flash array metric tracking module 30 is configured to store the read command address into (its) read command queue and set an address counter to the number of sectors/pages in this particular read command at block 525. The page read command and page read variants require an extra processing step (by the flash array metric tracking module 30) as they are requesting data from the flash device, and the raw bit error rate (RBER) data will need to be monitored and associated with the corresponding ECC sectors from the page read (by the flash array metric tracking module 30). For each page read, the flash array metric tracking module 30 will record/store the address (from which the read occurred in the flash device array 110) and a (ECC) sector counter will be set to a value of the number of ECC sectors/page which is a known constant prior to the start of metric recording. All read accesses will be treated as in order execution, which means that if three page reads are executed, the data for the first read will be returned (to the flash array metric tracking module 30) before the data for the second read and so on.

When the flash array metric tracking module 30 determines that a read data event occurs, the data sent (in the read data event) from the data comparator 50 will be a count of the number of failing bits per ECC sector. Upon receipt of this information (i.e., for this read data event) two actions occur. First, the flash array metric tracking module 30 obtains the associated read address from the read command address queue by looking at the oldest entry in the table at block 530. The read command (address) queue in the flash array metric tracking module 30 contains the table.

Second, using this read address, the flash array metric tracking module 30 will index into the proper memory location based on this read address and decrement the corresponding ECC sector counter at block 535. Optionally, if the ECC sector counter=0, the address will be removed from the read command address queue at block 540. Finally, the number of failing bits is stored (for this particular memory address location) by the flash array metric tracking module 30, and the flow returns to block 505.

The data of the failing bits (RBER statistics) will be recorded in a block index based array on the flash array metric tracking module 30. In the block index based array, based on the particular block (page) accessed, the failing bits counter on the flash array metric tracking module 30 will be incremented by the number of failing bits for the ECC sector and the total bits (counter) will be incremented by the number of bits in an ECC sector (this is known before the test starts). Also, an ECC sector histogram will be updated by the flash array metric tracking module 30, and the flash array metric tracking module 30 will increment the counter (bin) corresponding to the number of failing bits in the (particular) sector. These different recording/storage methods executed by the flash array metric tracking module 30 allow for understanding sector failure rate information across the entire set of memory devices 120 and also allow for block level understanding of raw bit error rates (RBER) for specific physical addresses within each individual memory device 120.

The following is an implementation example for the flash array metric tracking module 30 using a 256 GB drive (e.g., flash device array 110) with 16 flash devices sites (e.g., memory device sites 115). It is understood that this example is for explanation purposes and is not meant to be limiting.

Each memory site is composed of a 4 high stack of 32 GB monolithic die chips. Each 32 GB chip has 4096 Blocks. Total # of blocks/SSD=2^12(blocks/per chip)*2^2(chips/site)*2^4 (sites/SSD)=2^18 blocks/SSD=256 K unique blocks.

Using this approach, either an internal memory (of the controller chip 105, such as memory 32 in the flash array metric tracking module 30) and/or a portion of the flash device array 110 (such as the memory 48) can retain/store test information (discussed above for FIG. 5). This implementation will be useful for tracking in system use (such as regular read and write commands from the computer 5 (during normal operation) and corresponding input/output to and from the flash device array 110) and FA-BIST usage by the FA-BIST engine 55, 455 (when test analysis is run in test mode). As one option, an internal memory (on the controller chip 105, such as memory 32) will store a fixed number of records in a buffer; when the buffer gets near its threshold, the records can be stored in the flash device array 110 as meta data at a location that is controlled and protected (only) by (the FA-BIST engine 55, 455 of) the controller chip 105, such as memory 48. This is useful in scenarios where the significant drive runtime has occurred in the field and data can be extracted for analysis. This mechanism will aggregate all known runtime information from either the FA-BIST engine 55, 455 and/or from general flash device array usage and track wearing.

Some of the example metrics tracked (i.e., recorded/stored) by the flash array metric tracking module 30 are shown in Tables 1, 2, and 3.

TABLE 1

Command Based Metrics:

command count [commandType] - increments by 1 based on receipt of command
inter-arrival time average [commandType] - uses timer to calculate inter-arrival time average
inter-arrival time min [commandType]
inter-arrival time max [commandType]

TABLE 2

Address Based Metrics total bits read [block]
total bits failed [block]

TABLE 3

ECC Sector Based Metrics (histogram data)

0 bit fail count
1 bit fail count
. . .
. . .
N bit fail count

The total amount of storage required will equal the sum of the memory required to track the commandType, block data, and ECC sector data.

Now, further description of the flash trace array logic (module/circuit) 25 is provided below. The trace array logic 25 may be a block of logic designed to capture in-band commands between two or more other blocks of logic in order to enhance debug capability. The general functionality may be similar to that of a protocol analyzer, but is a tool that is built directly into each controller (such as the controller chip 105), allowing real-time debug regardless of the location of the device under test (DUT), such as the flash device array 110. Operators can access and use the trace array logic 25 on any system such as the system 100, 400 that they have debug access to. Various functionality of the trace array logic 25 is discussed below.

Access to the trace array logic 25: Access to the trace array logic 25 is controlled through the flash controller debug port 27. This allows for full configuration of the trace array functions based on the test and conditions at hand.

SATA/SAS (In-band) Command Logging: SATA is serial advanced technology attachment, and SAS is serial attached small computer system interface. The trace array logic 25 also contains the logic to monitor the high-speed interface between the controller chip 105 and the system (e.g., the host computer 5). This allows for debug of commands coming into the controller chip 105 and allows for debug of the translation (e.g., by the host protocol translator 10) of the command within the controller chip 105. For example, one might configure the trace array logic 25 to trace a write on the SAS interface and its corresponding program-erase on the flash bus side (that connects to the flash device array 110).

Trace Storage:

The trace array logic 25 sequentially stores the desired command stream within its own finite logic array and can be configured to stop when full and/or wrap until triggered or stopped. If required, one can also configure the trace array logic 25 to also store data directly on the flash device array 110 (e.g., in memory 48).

Command Capture:

The trace array logic 25 is designed to capture commands that are being sent to the flash device array 110 both directly from the computer 5 on the mainline bus 7 (of the controller chip 105) and the flash array built-in self test engine (FA-BIST engine 55, 455). Operators have the ability to configure the way they prefer to save commands, the desired commands to be saved, and a trigger point to start and stop the command capture. The command capture of the trace array logic 25 is an excellent debug tool as it can be used to verify that the computer 5 (host system) and controller chip 105 are behaving as expected and can also capture the stream of commands (from the computer 5) leading up to any failure and/or unexpected event.

Data Capture:

In addition to capturing commands, the trace array logic 25 is configured to also capture the data stream associated with the commands being sent to the flash device array 110. For example, the payload of a write command (from e.g., the computer 5 and/or the command sequencer 40) can be saved along with the actual command. This allows the operator to review both the commands and the data on the mainline bus 7 when desired.

Trace Array Trigger:

The trace array logic 25 can be configured to start and stop its captures (of data and commands) based on an operator defined command, a computer 5 (host system) interrupt, and/or a controller chip 105 interrupt. Although the default behavior of the trace array logic 25 is to capture all commands until stopped by an operator, it is sometimes desirable to instead start and stop the command capture based on a (particular type of) command that is observed on the mainline (command) bus 7. For example, the operator can configure the trace array logic 25 to start recording (i.e., storing) when the trace array logic 25 observes a write command and stop recording when the trace array logic 25 observes a read command. Another example is that the trace array logic 25 may be configured to stop recording on an interrupt from the controller chip 105. When the controller chip 105 throws an interrupt on a data integrity error, the trace array logic 25 stops recording, which allows the operator to review the commands and data on the mainline bus 7 leading up to that event (e.g., the data integrity error).

Command Playback:

As stated above, the trace array logic 25 is configured with the ability to play back a series of captured commands (e.g., on a display screen of the computer 5). This command playback function can be used to repeatedly send (by the command sequencer 40) the same stream of commands to the flash device array 110 and look for differences in results by having the trace array logic 25 playback the desired commands. For example, the command playback of the captured commands can also be used to replay a set of commands leading up to an observed event, be it expected or not.

Event and Statistic Recording:

The trace array logic 25 is configured with the capability of recording a number of important metrics from runtime (e.g., the normal operation of the computer 5 interfacing with the flash device array 110) and/or from the FA-BIST engine 55, 455. These metrics include the FA-BIST engine runtime, current RBER (raw BER), maximum RBER, minimum RBER, read count (i.e., number of read commands), program-erase count (i.e., number or program erase commands), last access time, average access time, dwell time, simultaneous active die, and/or write amplification. Some of these functions may require additional data manipulation, and/or may be implemented in conjunction with the flash array metric tracking module 30. Note that although the trace array logic 25 and flash array metric tracking module 30 are shown as separate elements, their respective functions and operations may be integrated (combined) into a single circuit or module and/or integrated into one or more circuits or modules in an implementation.

Garbage Collection Trace:

As part of the general controller logic functions, the trace array logic 25 is configured to log the flash garbage collection procedures (of the controller chip 105). The flash garbage collection procedures are when the controller chip 105 (e.g., the flash mainline management controller 15) does some cleanup of various blocks (of the flash device array 110) in order to run more efficiently. In order to verify flash garbage collection procedures by the controller chip 105, the trace array logic 25 is utilized to log the set of (garbage collection) commands that are internally tagged as being used for garbage collection.

Figure 6:
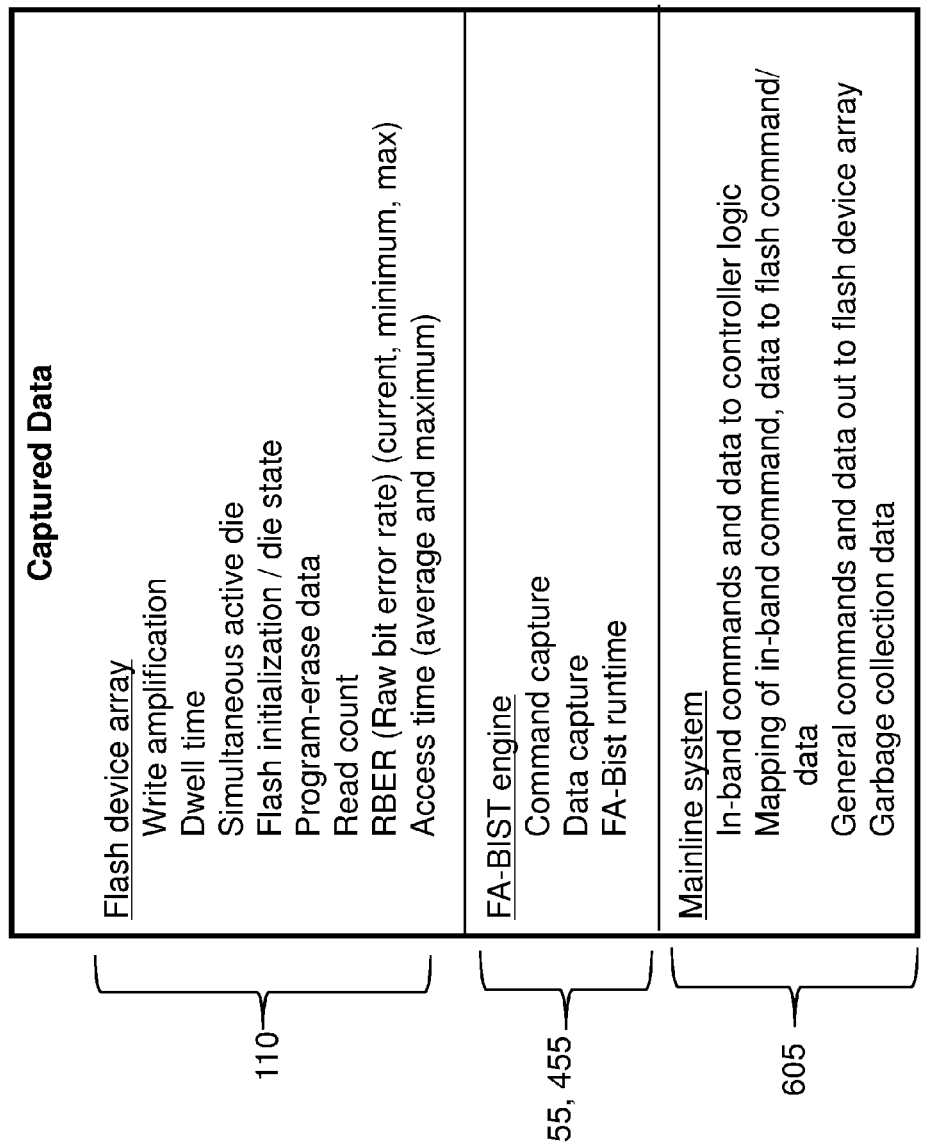
FIG. 6 illustrates a chart of captured data by a trace array logic module, a flash array metric tracking module, and/or by a combined circuit/module of both according to an exemplary embodiment.

FIG. 6 illustrates a chart 600 of captured data by the trace array logic 25, by the flash array metric tracking module 30, and/or by a combined circuit/module of both (the trace array logic 25 and the flash array metric tracking module 30) according to an exemplary embodiment. It is understood that the chart 600 is not meant to be exhaustive.

The chart 600 illustrates data captured from the flash device array 110, the FA-BIST engine 55, 455, and the mainline system 605. The mainline system 605 represents the elements that may typically be present without FA-BIST engine 55, 455, and the mainline system 605 may include the computer 5 (host system), the host protocol translator 10, the flash mainline management controller 15, the flash (I/O) ports 20, and/or the flash device array 110.

Data captured from the flash device array 110 may include write amplification, dwell time, simultaneous active die, flash device array initialization/die state, program-erase (PE) data, read count, RBER (raw bit error rate) (current and minimum/maximum), and/or access time (average and maximum). Dwell time is the time interval between block erase accesses to a specific physical address in the memory device 120 of the flash device array 110.

Data captured from the FA-BIST engine 55, 455 may include command capture, data capture, and FA-BIST runtime. Data captured from the mainline system 605 may include in-band commands and data to controller logic of the flash mainline management controller 15, mapping of in-band commands and data to the flash device array 110, general commands and data out to flash device array 110, and garbage collection data.

Figure 7:
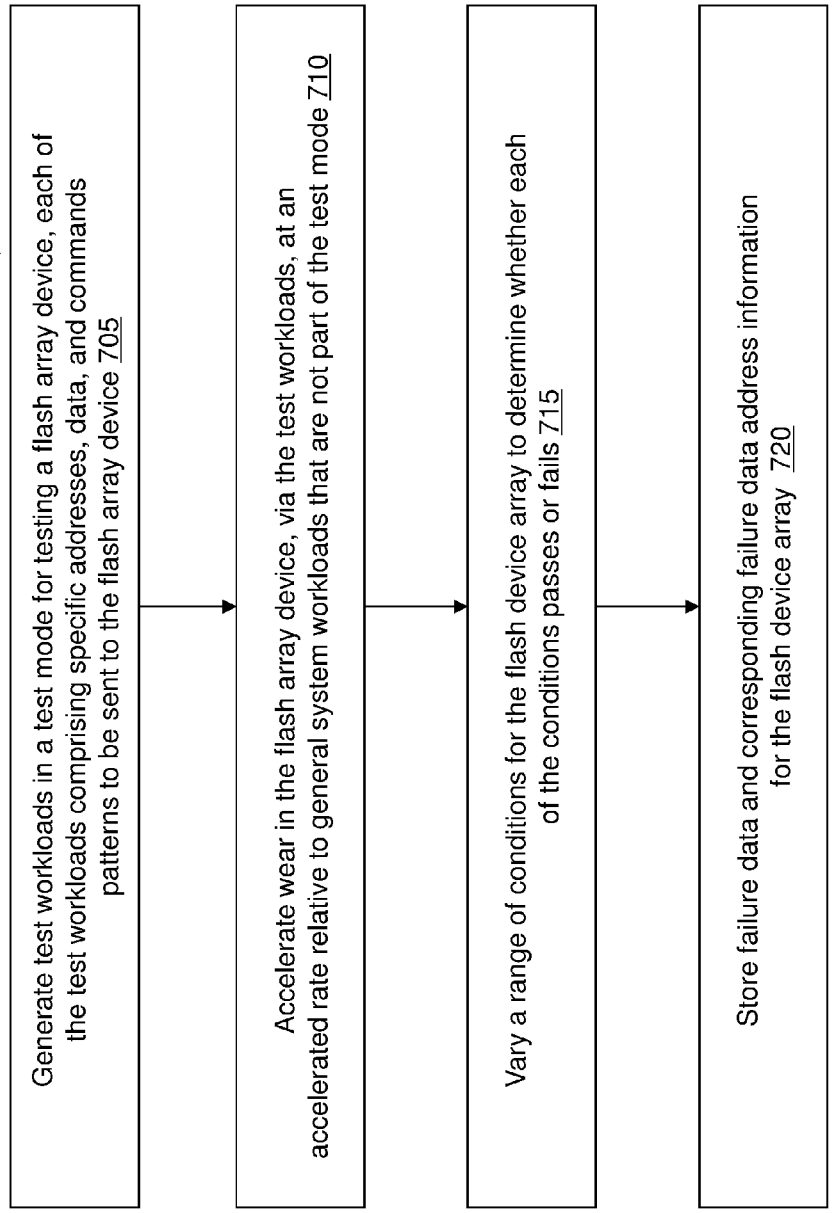
FIG. 7 illustrates a flow chart of a process executed by one or more circuits implementing a flash array built in test engine according to an exemplary embodiment.

FIG. 7 illustrates a flow chart of a process executed by one or more circuits implementing the flash array built in test engine 55, 455 (on the controller chip 105) according to an exemplary embodiment.

Test workloads are generated (by the command sequencer 40) in a test mode for testing the flash device array 110, where each of the test workloads may include specific addresses (of blocks in a memory device 102 and/or of memory devices 120), data, and command patterns to be sent to the flash device array at block 705. Wear in the flash device array 110 is accelerated, via the test workloads, at an accelerated rate relative to general system workloads that are not part of the test mode at block 710, because the command sequencer 40 can repeatedly write and erase each individual block and/or each individual memory device 120 without going through the flash mainline management controller 15.

A range of conditions are varied for the flash device array 110 to determine whether each of the conditions passes or fails at block 715. In one case, the operator may adjust conditions in the flash device array 110 and/or in another case, the command sequencer 40 may sends commands to the flash device array to adjust the conditions. Failure data and corresponding failure data address information (of each block and/or memory device 120) are stored (e.g., in buffer memory 47, in memory 32, and/or in the buffer memory 48 of the flash device array 110) for the flash device array 110 at block 720.

The test workloads generated in the test mode are configured to: test specific page program and block erase loops on the flash device array 110, to test specific read interval loops on the flash device array 110, and to test programmable physical device interval time for evaluating dwell time effect on bit error rate for the flash device array 110.

Varying the range of conditions for the flash device array 110 includes the flash array built in test engine circuit 55, 455 varying one variable at a time out of a plurality of variables while not changing the other variables. Each of variables that gets selectively varied (one at a time) may include a timing knob, voltage of the flash device array 110, and/or temperature of the flash device array 110, while the other variables remain constant.

Additionally, the flash array metric tracking circuit 30 may be executed, and for each of the (individual) memory devices 120 in the flash device array 110, the flash array metric tracking circuit 30 is configured to track usage data, frequency of access, and bit error rates. Also, the flash array tracking metric circuit 30 is configured to snoop the mainline bus 7 to and from the flash device array 110 and to snoop paths (i.e., all paths connecting to the mainline bus 7 from elements/modules/circuits 25, 30, 40, and 50) from the flash array built in test engine 55, 455 to the flash device array 110, in order to track bit error rate data independent of an operation mode (independent of whether in the test mode and normal operation). The flash array tracking metric circuit 30 is configured to capture data when running during the test mode and when running during the mainline mode (normal operation). The mainline mode corresponds to the general system workloads generated by a host system (e.g., computer 5) for normal operation in which the general system workloads are not part of the test mode. The flash array tracking metric circuit 30 is configured to display failure analysis captured during runtime in response to a flash error in the flash device array 110.

The flash trace array logic 25 is configured to execute in-band command logging; trace storage for command capture; data capture based on a trace array logic trigger; command playback; event and statistic recording; and/or garbage collection trace.

Figure 8:
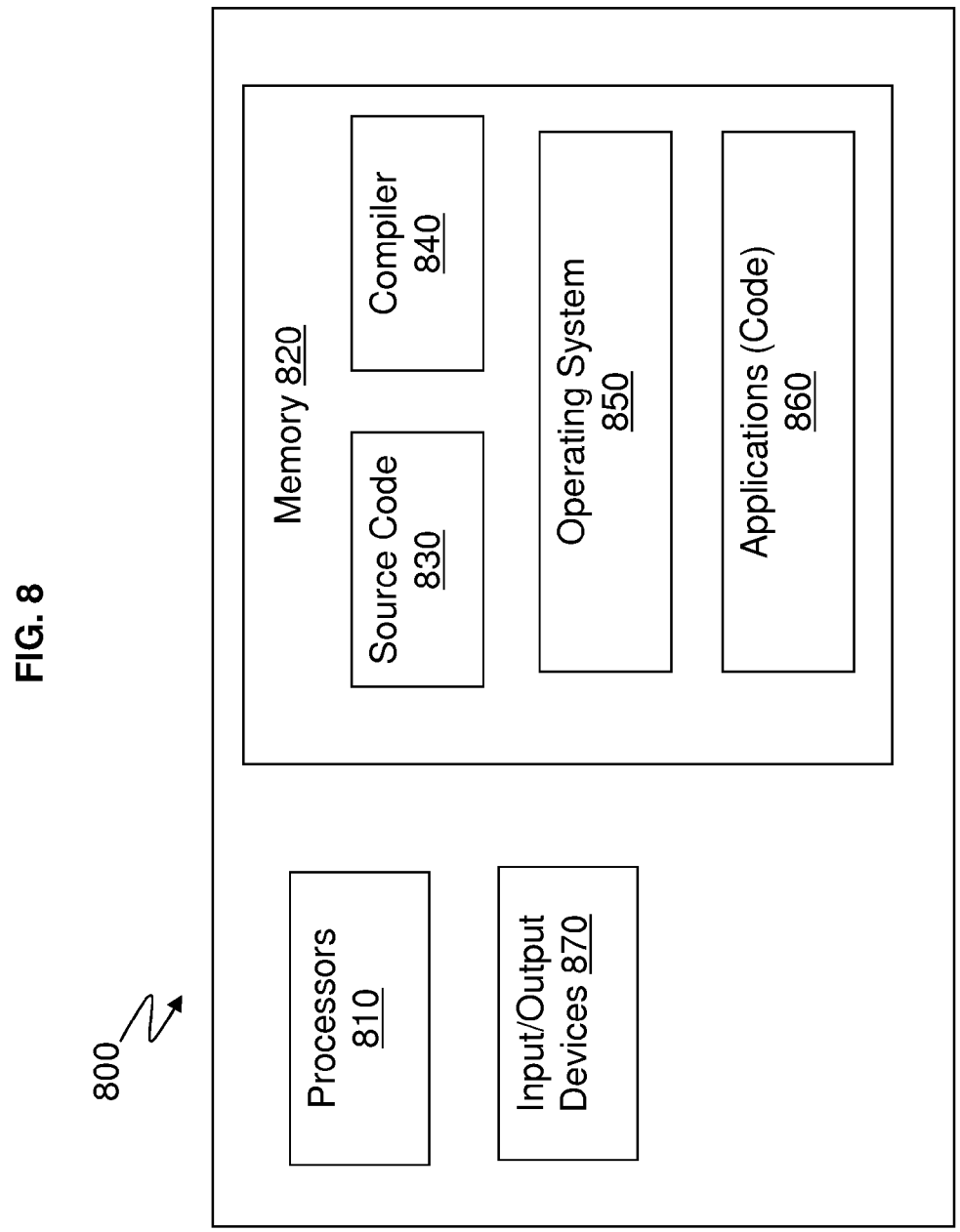
FIG. 8 illustrates an example of a computer having capabilities/elements, which may be included in exemplary embodiments.

FIG. 8 illustrates an example of a computer 800 having capabilities, which may be included in exemplary embodiments. Various methods, procedures, modules, flow diagrams, tools, application, circuits, elements, and techniques discussed herein may also incorporate and/or utilize the capabilities of the computer 800. Moreover, capabilities of the computer 800 may be utilized to implement features of exemplary embodiments discussed herein. One or more of the capabilities of the computer 800 may utilized implement, connect to, and/or support any element discussed herein (as understood by one skilled in the art) such as but not limited to the computer 5 (host system), the FA-BIST engine 55, 455, the modules/circuits 25, 27, 30, 35, 40, 45, 47, 50, the controller chip 105, and/or the flash device array 110.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a macroprocessor.

The computer readable memory 820 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 820 may incorporate electronic, magnetic, optical, and/or other types of storage media. Note that the memory 820 can have a distributed architecture, where various components are situated remote from one another, but can be accessed by the processor 810.

The software in the computer readable memory 820 may include one or more separate programs, each of which comprises an ordered listing of executable instructions for implementing logical functions. The software in the memory 820 includes a suitable operating system (O/S) 850, compiler 840, source code 830, and one or more applications 860 of the exemplary embodiments. As illustrated, the application 860 comprises numerous functional components for implementing the features, processes, methods, functions, and operations of the exemplary embodiments. The application 860 of the computer 800 may represent numerous applications, agents, software components, modules, interfaces, controllers, etc., as discussed herein but the application 860 is not meant to be a limitation.

The operating system 850 may control the execution of other computer programs, and provides scheduling, input-output control, file and data management, memory management, and communication control and related services.

The application(s) 860 may employ a service-oriented architecture, which may be a collection of services that communicate with each. Also, the service-oriented architecture allows two or more services to coordinate and/or perform activities (e.g., on behalf of one another). Each interaction between services can be self-contained and loosely coupled, so that each interaction is independent of any other interaction.

Further, the application 860 may be a source program, executable program (object code), script, or any other entity comprising a set of instructions to be performed. When a source program, then the program is usually translated via a compiler (such as the compiler 840), assembler, interpreter, or the like, which may or may not be included within the memory 820, so as to operate properly in connection with the O/S 850. Furthermore, the application 860 can be written as (a) an object oriented programming language, which has classes of data and methods, or (b) a procedure programming language, which has routines, subroutines, and/or functions.

The I/O devices 870 may include input devices (or peripherals) such as, for example but not limited to, a mouse, keyboard, scanner, microphone, camera, etc. Furthermore, the I/O devices 870 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), etc.).

When the computer 800 is in operation, the processor 810 is configured to execute software stored within the memory 820, to communicate data to and from the memory 820, and to generally control operations of the computer 800 pursuant to the software. The application 860 and the O/S 850 are read, in whole or in part, by the processor 810, perhaps buffered within the processor 810, and then executed.

When the application 860 is implemented in software it should be noted that the application 860 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 860 can be embodied in any computer-readable medium 820 for use by or in connection with an instruction execution system, apparatus, server, or device, such as a computer-based system, processor-containing system, or other system that can fetch the instructions from the instruction execution system, apparatus, or device and execute the instructions. In the context of this document, a "computer-readable storage medium" can be any means that can store, read, write, communicate, or transport the program for use by or in connection with the instruction execution system, apparatus, or device. The computer readable medium can be, for example but not limited to, an electronic, magnetic, optical, or semiconductor system, apparatus, or device.

More specific examples (a nonexhaustive list) of the computer-readable medium 820 would include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 860 is implemented in hardware, the application 860 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 800 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A flash array test engine, comprising:
a circuit, the circuit being configured to:
generate test workloads in a test mode for testing a flash device array, each of the test workloads comprising specific addresses, data, and command patterns to be sent to the flash device array;
accelerate wearing in the flash device array, via the test workloads, during the test mode, wherein the accelerate wearing in the flash device array comprises continuously executing commands of at least one of reading, writing, and erasing a same memory block of the flash device array and not spreading the commands to other available memory blocks in the flash device array;
vary a range of conditions for the flash device array to determine whether each of the conditions passes or fails; and
store failure data and corresponding failure data address information for the flash device array.

2. The flash device array of claim 1, wherein the test workloads generated in the test mode are configured to: test specific page program and block erase loops on the flash device array, to test specific read interval loops on the flash device array, and to test programmable physical device interval time for evaluating dwell time effect on bit error rate for the flash device array.

3. The flash device array of claim 1, wherein varying the range of conditions for the flash device array comprises the circuit varying one variable at a time out of a plurality of variables while not changing others; and
    wherein the one variable comprises a timing knob, voltage, and temperature of the flash device array.

4. The flash array test engine of claim 1, further comprising a flash array metric tracking circuit;
    wherein, for memory devices in the flash device array, the flash array metric tracking circuit is configured to track usage data, frequency of access, and bit error rates.

5. The flash array test engine of claim 4, wherein the flash array tracking metric circuit is configured to snoop a mainline bus to and from the flash device array and to snoop paths from the flash array test engine to the flash device array, in order to track bit error rate data independent of an operation mode.

6. The flash array test engine of claim 4, wherein the flash array tracking metric circuit is configured to capture data when running during the test mode and when running during a mainline mode;
    wherein the mainline mode corresponds to the general system workloads generated by a host system for normal operation in which the general system workloads are not part of the test mode; and
    wherein the flash array tracking metric circuit is configured to display failure analysis captured during runtime in response to a flash error in the flash device array.

7. The flash array test engine of claim 1, further comprising flash trace array logic configured to execute at least one of: in-band command logging; trace storage for command capture; data capture based on a trace array logic trigger; command playback; event and statistic recording; and garbage collection trace.

8. A method for implementing a flash array test engine circuit, comprising:
    generating test workloads in a test mode for testing a flash device array, each of the test workloads comprising specific addresses, data, and command patterns to be sent to the flash device array;
    accelerating wearing in the flash device array, via the test workloads, during the test mode, wherein the accelerating wearing in the flash device array comprises continuously executing commands of at least one of reading, writing, and erasing a same memory block of the flash device array and not spreading the commands to other available memory blocks in the flash device array;
    varying a range of conditions for the flash device array to determine whether each of the conditions passes or fails; and
    storing failure data and corresponding failure data address information for the flash device array.

9. The method of claim 8, wherein the test workloads generated in the test mode are configured to: test specific page program and block erase loops on the flash device array, to test specific read interval loops on the flash device array, and to test programmable physical device interval time for evaluating dwell time effect on bit error rate for the flash device array.

10. The method of claim 8, wherein varying the range of conditions for the flash device array comprises the flash array test engine circuit varying one variable at a time out of a plurality of variables while not changing others; and
    wherein the one variable comprises at least one of a timing knob, voltage, and temperature of the flash device array.

11. The method of claim 8, further comprising executing a flash array metric tracking circuit;
    wherein, for memory devices in the flash device array, the flash array metric tracking circuit is configured to track usage data, frequency of access, and bit error rates.

12. The method of claim 11, wherein the flash array tracking metric circuit is configured to snoop a mainline bus to and from the flash device array and to snoop paths from the flash array test engine circuit to the flash device array, in order to track bit error rate data independent of an operation mode.

13. The method of claim 11, wherein the flash array tracking metric circuit is configured to capture data when running during the test mode and when running during a mainline mode;
    wherein the mainline mode corresponds to the general system workloads generated by a host system for normal operation in which the general system workloads are not part of the test mode; and
    wherein the flash array tracking metric circuit is configured to display failure analysis captured during runtime in response to a flash error in the flash device array.

14. The method of claim 8, further comprising executing flash trace array logic configured to execute: in-band command logging; trace storage for command capture; data capture based on a trace array logic trigger; command playback; event and statistic recording; and garbage collection trace.

15. A computer program product comprising a computer readable storage medium having computer readable instructions stored thereon that, when executed by a computer, implement a method for implementing a flash array test engine circuit, the method comprising:
    generating test workloads in a test mode for testing a flash device array, each of the test workloads comprising specific addresses, data, and command patterns to be sent to the flash device array;
    accelerating wearing in the flash device array, via the test workloads, during the test mode, wherein the accelerating wearing in the flash device array comprises continuously executing commands of at least one of reading, writing, and erasing a same memory block of the flash device array and not spreading the commands to other available memory blocks in the flash device array;
    varying a range of conditions for the flash device array to determine whether each of the conditions passes or fails; and
    storing failure data and corresponding failure data address information for the flash device array.

16. The computer program product of claim 15, wherein the test workloads generated in the test mode are configured to: test specific page program and block erase loops on the flash device array, to test specific read interval loops on the flash device array, and to test programmable physical device interval time for evaluating dwell time effect on bit error rate for the flash device array.

17. The computer program product of claim 15, wherein varying the range of conditions for the flash device array comprises the flash array test engine circuit varying one variable at a time out of a plurality of variables while not changing others; and
    wherein the one variable comprises a timing knob, voltage, and temperature of the flash device array.

18. The computer program product of claim 15, further comprising computer readable instructions for executing a flash array metric tracking circuit;
    wherein, for memory devices in the flash device array, the flash array metric tracking circuit is configured to track usage data, frequency of access, and bit error rates.

19. The computer program product of claim 18, wherein the flash array tracking metric circuit is configured to snoop a mainline bus to and from the flash device array and to snoop paths from the flash array test engine circuit to the flash device array, in order to track bit error rate data independent of an operation mode.

20. The computer program product of claim 18, wherein the flash array tracking metric circuit is configured to capture data when running during the test mode and when running during a mainline mode;
- wherein the mainline mode corresponds to the general system workloads generated by a host system for normal operation in which the general system workloads are not part of the test mode; and
- wherein the flash array tracking metric circuit is configured to display failure analysis captured during runtime in response to a flash error in the flash device array.

\* \* \* \* \*